United States Patent
Goeritz

(10) Patent No.: US 10,263,578 B2
(45) Date of Patent: Apr. 16, 2019

(54) POWER AMPLIFIER, A RADIO FREQUENCY ELECTRONIC DEVICE AND A METHOD FOR OPERATING A POWER AMPLIFIER

(71) Applicant: Rohde & Schwarz GmbH & Co. KG, Munich (DE)

(72) Inventor: Raimon Goeritz, Berlin (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/060,385

(22) PCT Filed: Dec. 8, 2016

(86) PCT No.: PCT/EP2016/080221
§ 371 (c)(1),
(2) Date: Jun. 7, 2018

(87) PCT Pub. No.: WO2017/097885
PCT Pub. Date: Jun. 15, 2017

(65) Prior Publication Data
US 2018/0367109 A1 Dec. 20, 2018

(30) Foreign Application Priority Data
Dec. 11, 2015 (EP) .................................. 15199591

(51) Int. Cl.
*H04B 1/04* (2006.01)
*H03F 3/24* (2006.01)
(Continued)

(52) U.S. Cl.
CPC ............... *H03F 3/24* (2013.01); *G01R 27/06* (2013.01); *H03F 1/52* (2013.01); *H04B 1/0458* (2013.01);
(Continued)

(58) Field of Classification Search
CPC .......... H04B 1/0458; H03F 3/24; H03F 1/52; H03F 2200/451; H03F 2200/465
See application file for complete search history.

(56) References Cited

U.S. PATENT DOCUMENTS

| 4,727,337 A | 2/1988 | Jason |
| 7,440,731 B2 | 10/2008 | Staudinger et al. |
| (Continued) | | |

FOREIGN PATENT DOCUMENTS

| WO | 87/03378 A1 | 6/1987 |
| WO | 2005/022740 A2 | 3/2005 |

OTHER PUBLICATIONS

International Search Report dated Feb. 23, 2017, issued in corresponding International Application No. PCT/EP2016/080221, filed Dec. 8, 2015, 3 pages.
(Continued)

*Primary Examiner* — Tuan Pham
(74) *Attorney, Agent, or Firm* — Christensen O'Connor Johnson Kindness PLLC

(57) ABSTRACT

A power amplifier with adjustable voltage standing wave ratio is described which comprises an amplifier unit, a coupler configured to obtain an incident power and a coupled reflected power, and a power control unit. The power control unit is configured to control the amplifier unit. The power control unit has two power detectors configured to provide actuating variables which correspond to the incident power and the reflected power, respectively. The power control unit comprises two digital potentiometers which are configured to variably weight the actuating variables wherein the power control unit is configured to determine a control variable for the amplifier unit based on the actuating variables such that a predetermined power level related to a set value of the voltage standing wave ratio is not
(Continued)

Figure 1:
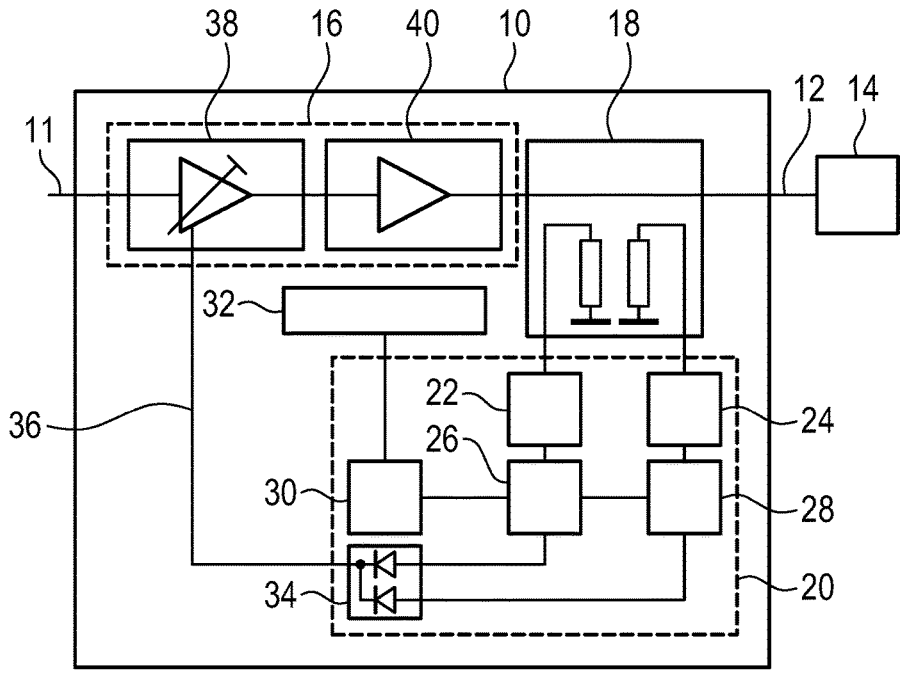

exceeded by the incident power and/or the reflected power. Further, a radio frequency electronic device and a method are described.

15 Claims, 2 Drawing Sheets

(51) Int. Cl.
    *H03F 1/52*         (2006.01)
    *G01R 27/06*     (2006.01)

(52) U.S. Cl.
    CPC ............... *H03F 2200/426* (2013.01); *H03F 2200/451* (2013.01)

(56) References Cited

U.S. PATENT DOCUMENTS

| | | | |
|---|---|---|---|
| 2007/0066224 A1* | 3/2007 | d'Hont | G06K 7/0008 455/41.2 |
| 2007/0259628 A1 | 11/2007 | Carmel et al. | |
| 2014/0330265 A1* | 11/2014 | Hancock | A61B 18/18 606/33 |
| 2016/0028420 A1* | 1/2016 | Srirattana | H04B 1/40 455/127.2 |

OTHER PUBLICATIONS

Written Opinion of the International Searching Authority dated Feb. 23, 2017, issued in corresponding International Application No. PCT/EP2016/080221, filed Dec. 8, 2015, 7 pages.

Cossio, J.C., "CMOS IC Makes Low-Cost Digital Potentiometer." EDN Electrical Design News (Texas Instrument), Reed Business Information, Highlands Ranch, CO, US, vol. 41, No. 2, Jan. 18, 1996, <https://www.edn.com/design/other/4349898/EDN-Access-01-18-96-CMOS-IC-makes-low-cost-digital-potentiomete> [retrieved Jun. 7, 2018], 2 pages.

International Preliminary Report of Patentability and Written Opinion dated Jun. 12, 2018, issued in corresponding International Application No. PCT/EP2016/080221, filed Dec. 8, 2016, 9 pages, (Feb. 9, 2019).

* cited by examiner

POWER AMPLIFIER, A RADIO FREQUENCY ELECTRONIC DEVICE AND A METHOD FOR OPERATING A POWER AMPLIFIER

The invention relates to a power amplifier, a radio frequency electronic device and a method for operating a power amplifier.

A power amplifier, in particular a broadband amplifier, is suitable for a wide range of practical applications and frequencies. In general, a broadband amplifier always has a certain frequency response as it emits different powers at different frequencies depending on the load connected to the power amplifier.

For instance, an antenna system can be connected to the power amplifier wherein the antenna system represents a load which generally has an influence on the characteristics of signal transmission. Typically, this influence is indicated by the so called voltage standing wave ratio (VSWR) being a measure of impedance matching of the transmission line of the power amplifier and the load connected thereto. This VSWR is related to the incident power of the outgoing signal and the reflected power based on the outgoing signal. The incident power is also called transmit power or transmitted power.

When the power amplifier is designed to withstand a high impedance mismatch, the power amplifier has to be robust at all frequencies being expected to be processed by the power amplifier.

It is known to restrict the power amplifier in order to keep the incident power and/or the reflected power constant when the VSWR value is reached for which the power amplifier is designed. Thus, no overloads occur. For instance, the power amplifier may have a VSWR 6 protection which means that at most half of the incident power can be reflected before the power of the power amplifier is limited.

In general, such a protection is obtained by weighting the incident power and the reflected power by fixed attenuators. For instance, the VSWR 6 protection is obtained by uprating the reflected power by 3 dB more than the incident power. Thus, a 1 dB attenuator in the incident power line and a 4 dB attenuator in the reflected power line can be provided to realize the VSWR 6 protection. A corresponding power level of the power amplifier is related to the kind of protection level, in particular the maximum allowed reflected power.

Typically, the amplifiers are designed such that the full nominal power can be delivered at the maximum allowed VSWR value of the power amplifier, for instance a VSWR value of 6. Accordingly, the power amplifier has a lot of unused capacities at lower impedance mismatches as these capacities are only used in the very special case when the high impedance mismatch is present. For calibrating purposes a higher power would be preferable, but the existing capacities of the power amplifier cannot be used as the attenuators have fixed damping values resulting in a fixed full nominal power regardless the actual impedance mismatch (VSWR value).

The invention provides a power amplifier with adjustable voltage standing wave ratio comprising an amplifier unit generating an output signal, a coupler configured to obtain an incident power of the output signal and a coupled reflected power based on the output signal, and a power control unit coupled to the coupler and the amplifier unit wherein the power control unit is configured to control the amplifier unit according to the powers obtained by the coupler. According to the invention, the power control unit comprises two power detectors configured to provide actuating variables which correspond to the incident power and the reflected power, respectively. The power control unit comprises two digital potentiometers which are configured to variably weight the actuating variables wherein the power control unit is configured to determine a control variable for the amplifier unit based on the actuating variables such that a predetermined power level related to a set value of the voltage standing wave ratio is not exceeded by the incident power and/or the reflected power.

The invention also provides a radio frequency electronic device comprising a power amplifier as mentioned above.

The invention further provides a method for operating a power amplifier with adjustable voltage standing wave ratio comprising the following steps:

Measuring the incident power of the output signal by a controller,

Measuring the reflected power of the output signal by the controller,

Providing actuating variables corresponding to the measured powers by a power control unit, Weighting the actuating variables variably by the power control unit, Determining a control variable for the amplifier unit based on the actuating variables by the power control unit such that a predetermined power level related to a set value of the voltage standing wave ratio is not exceeded by the incident power and/or the reflected power.

The invention is based on the finding that the power signals can be weighted variably due to the digital potentiometers such that the amplifier can be operated in different modes depending on the requirements/needs. For instance, the amplifier can be operated in a calibration mode with a high incident power as a low VSWR is expected or in a safety mode with a lower power enabling a higher VSWR when a certain load is connected to the power amplifier. Accordingly, the unused capacities being provided for operating the amplifier with a high VSWR protection can be used when the amplifier is switched to another mode where a lower VSWR is sufficient. The operation mode representing a certain VSWR value can be selected by the user or the dedicated VSWR value can be set directly by the user. Each mode or VSWR value to be set corresponds to a certain predetermined power level which will not be exceeded by the incident power and/or the reflected power during operation of the power amplifier.

According to an aspect of the invention, an analog power limitation is provided in order to ensure that the predetermined power level related to the set value of the voltage standing wave ratio is not exceeded. As fast signals are processed, the analog power limitation has certain advantages compared to a dynamic power limitation established by micro controllers which detect and analyze the power signals in advance. Due to the analog power limitation, the limiting power level is preset in dependency of the set VSWR value.

Preferably, the power control unit is configured to sum up the actuating variables in order to provide the control variable for the amplifier unit. This ensures that the power level corresponding to the set VSWR value is not exceeded by the incident and reflected powers. If the sum exceeds the predetermined power level, the power of the amplifier unit will be limited. Accordingly, it is ensured that neither the incident power nor the reflected power exceeds the corresponding portion of the predetermined power level related to the set VSWR value.

According to a preferred embodiment, the power detectors are configured to convert the incident power and the reflected power into direct voltages, respectively. Thus, the actuating values are direct voltages which can be processed easily by the power control unit. Further, a direct voltage is preferred as a control variable, for instance for controlling the amplifier unit.

Further, an amplifier control can be provided which is coupled to the digital potentiometers in order to adjust the weighting of the actuating variables easily. The digital potentiometers can be adjusted by the amplifier control, in particular by an input interface being connected to the amplifier control such as a touch display or a separate input device. Thus, the weighting ratio of the actuating variables is flexibly adjustable in order to adjust the protection level of the power amplifier depending on the requirements/needs, for instance a VSWR 6 protection or lower.

According to a preferred embodiment, the power control unit is connected to the amplifier unit by a feedback line. The feedback line is a galvanic connection being implemented between the power control unit and the amplifier unit. Thus, no digital algorithm of a control is provided which algorithm is used for determining working points and/or amplification factors of the power amplifier.

Particularly, the amplifier unit comprises a power pre-amplifier that is driven via the feedback line. The power pre-amplifier is directly driven by the power control unit via the feedback line such that a direct feedback depending on the output signal is possible created by the amplifier unit.

Preferably, an input interface is provided by which the value of the voltage standing wave ratio is set during operation or prior to operation. This input interface can be a touch display integrated in the power amplifier or a software interface for connecting a computer to the power amplifier. Hence, the VSWR value can be set during operation. Alternatively, the power amplifier is configured by a firmware prior to operation.

The power amplifier may be configured to be operated in at least two different modes having different voltage standing wave ratios. Thus, the voltage standing wave ratio is not just adapted to a deviation of the temperature or any other operation parameter. The (operation) mode is changed in order to use hidden reserves or unused capacities of the power amplifier regarding its operational characteristics.

According to an aspect, an attenuation element in the power amplifier is activated by the control variable. This ensures that the power of the power amplifier is limited such that the predetermined power level is not exceeded. The analog power limitation of the power amplifier is established, accordingly.

Preferably, the actuating variables are summed up in order to determine the control variable for the amplifier unit. Hence, it can be ensured that neither the incident power nor the reflected power exceeds the predetermined power level as the actuating variables represent the incident power and the reflected power.

Particularly, the actuating variables are weighted such that the sum of the incident power and the reflected power is substantially constant. This ensures that the components of the amplifier are protected irrespective of the set VSWR value and the corresponding power level.

According to a preferred embodiment, the actuating variables are obtained by converting the measured incident and reflected powers into corresponding direct voltages. Direct voltages can be processed easily by the power amplifier, in particular its power control unit. In general, a direct voltage is preferred as control variable for controlling the amplifier unit, in particular an attenuation element in the amplifier unit.

Preferably, the value of the voltage standing wave ratio is set during operation or prior to operation. The user and/or manufacturer can set the voltage standing wave ratio prior to the operation by a firmware update of the power amplifier. Alternatively, the VSWR value can be set during operation via an input interface, in particular a software interface. For example, this can be done via a touch display, a keypad, keys or a computer being connected to the input interface of the power amplifier. In general, a certain operation mode can be selected which represents a corresponding VSWR value. Alternatively, a VSWR value can be set directly.

Figure 2:
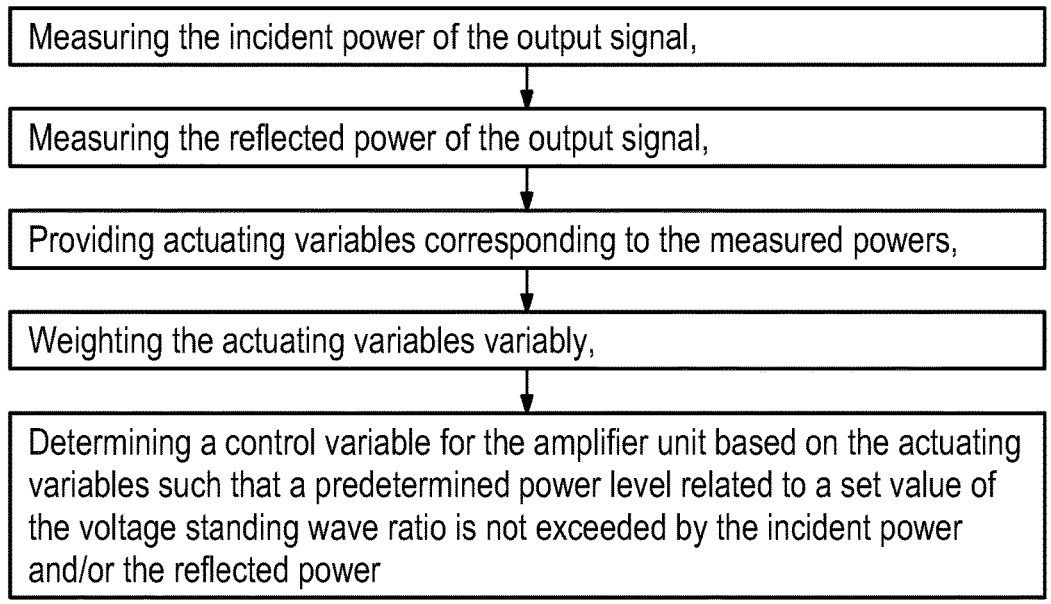
Figure 3:
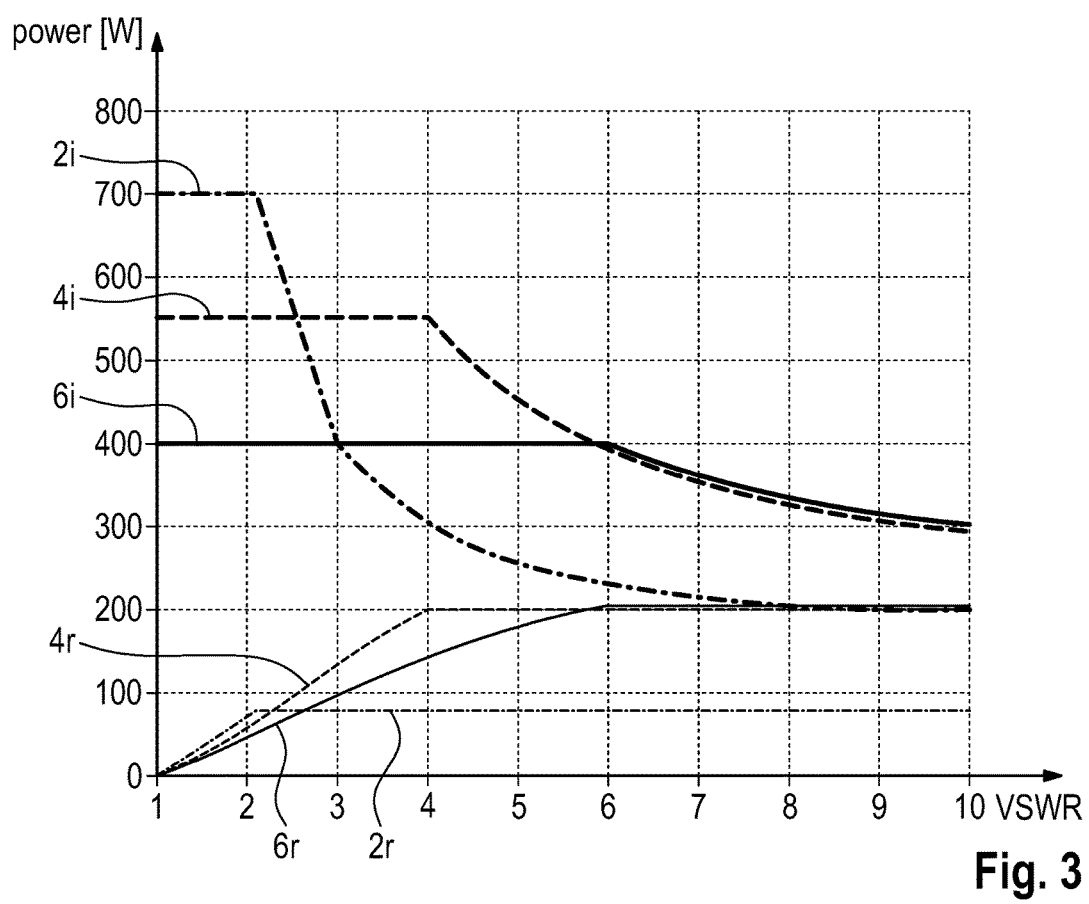

The invention will now be described with reference to a preferred embodiment which is shown in the enclosed drawings. In the drawings, FIG. 1 schematically shows a power amplifier according to the invention, FIG. 2 shows a flow chart of the method for operating a power amplifier according to the invention, and FIG. 3 shows a diagram of the output power of the amplifier according to the invention in different operation modes.

In FIG. 1, a power amplifier 10 for a radio frequency electronic device is schematically shown. The power amplifier 10 has an inlet 11 and an outlet 12 to which a load 14 is connected, for instance an antenna system.

The incoming signal is amplified by the power amplifier 10 such that an amplified output signal is issued via the outlet 12 to the load 14. Accordingly, the power amplifier 10 comprises an amplifier unit 16 which generates the amplified output signal. The output signal is put forward to the load 14 wherein the output signal can be partly reflected wherein the reflectance depends on the impedance mismatch of the power amplifier 10, in particular its transmission line, and the load 14. Accordingly, a certain amount of the incident power is reflected back into the power amplifier 10. This fraction is called reflected power. The incident power is also called transmit power or transmitted power.

The relation of the incident power to the reflected power is typically indicated by the so called voltage standing wavelength ratio (VSWR). A high VSWR value is related to a high impedance mismatch and a high reflectance.

Further, power amplifier 10 comprises a coupler 18 in order to measure the incident power of the output signal and the reflected power based on the output signal. A directional coupler can be used for measuring the powers.

These measured signals are processed by the power amplifier 10, in particular a power control unit 20 of the power amplifier 10. Power control unit 20 is connected to the coupler 18 and the amplifier unit 16 in order to control the amplifier unit 16 in dependence of the measured signals, in particular their powers.

Power control unit 20 comprises two power detectors 22, 24 which are related to the coupler 18, in particular the signal line for the obtained incident power and the signal line for the obtained reflected power, respectively. The power detectors 22, 24 process the obtained powers such that actuating variables are provided for controlling the power amplifier 10 as will be described later. The actuating variables still represent the powers obtained.

Further, power control unit 20 has two digital potentiometers 26, 28 which are connected to the power detectors 22, 24, respectively. The digital potentiometers 26, 28 are used to weight the obtained actuating variables in a certain manner to ensure that the reflected power and the incident power do not exceed the predetermined power level. This is realized by a power limitation of the power amplifier 10 as will be explained later. Since the digital potentiometers 26, 28 can be adjusted variably, the actuating variables are weight variably by the digital potentiometers 26, 28. Accordingly, an adjustable power limitation is provided.

An amplifier control 30 controls the digital potentiometers 26, 28, in particular their weighting ratio. The amplifier control 30 is also connected to an input interface 32 the function of which will be described later with regard to the overall function of power amplifier 10 during operation.

Furthermore, the power control unit 20 comprises a summer 34 which sums up the signals of both digital potentiometers 26, 28, in particular the weighted actuating variables still representing the powers obtained. The summer 34 is directly connected to the amplifier unit 16 via a feedback line 36 which is realized by a galvanic connection.

Amplifier unit 16 comprises a power pre-amplifier 38 and a power main-amplifier 40 wherein the feedback line 36 is connected to the amplifier unit 16, in particular an attenuation element being incorporated in the amplifier unit 16. In the shown embodiment, the feedback line 36 is directly coupled to the power pre-amplifier 38.

Hereinafter, the operation of the power amplifier 10 is described in detail with reference to FIGS. 1 to 3.

The manufacturer of power amplifier 10 or a user can set a maximum VSWR value or select an operation mode related to a certain maximum VSWR value. In general, the operation mode or the VSWR value is set via the input interface 32 which can be a touch display or a keypad. Alternatively, the input interface 32 is connected to a computer or another processing unit which can be used as an input device. Accordingly, the input interface 32 may be a software interface. Further, the input interface 32 can be a wireless interface such as a Bluetooth-, NFC- or Wi-Fi-interface. According to other embodiments, the input interface 32 can be a manually operable control element, for example a setting wheel also called adjusting wheel, a potentiometer, a regulator or a knob, in particular a rotary knob.

A predetermined power level related to the VSWR value is set simultaneously when the operation mode or the VSWR value is set. This predetermined power level should not be exceeded by the power amplifier 10 during operation, in particular by the incident power of the output signal and/or by the reflected power based upon the output signal. For instance, the power amplifier 10 is operated with a VSWR 6 protection wherein an incident power of 400 W is allowed. Accordingly, the maximum allowed reflected power is 200 W due to the VSWR 6 protection.

By selecting the operation mode or the VSWR value, the amplifier control 30 controls the digital potentiometers 26, 28 such that they weight the actuating variables provided by the power detectors 22, 24 which relate to the incident power and the reflected power. As already mentioned, the actuating values are provided by the power detectors 22, 24 which convert the measured power signals into direct voltages being a variable which can be processed easily.

Generally, the power amplifier 10 is operated such that the dedicated maximum incident power is reached during operation in the selected operation mode or the set VSWR value. In the shown embodiment, the power amplifier 10 is designed to output 400 W incident power when it is operated with a VSWR 6 protection. Accordingly, the incident power is kept constant at 400 W as long as the reflected power does not reach approximately 200 W. If this value is reached, the power of the power amplifier 10 is reduced or limited in order to keep the reflected power constant and to protect the power amplifier 10 and its components.

This is ensured by the variable control of the digital potentiometers 26, 28 as the weighting of the actuating variables is performed such that the reflected power is uprated by 3 dB with respect to the incident one. Thus, the predetermined power level is neither exceeded by the incident power nor the reflected power due to the weighting ratio related to the set VSWR protection.

In FIG. 3, a diagram is shown wherein the incident power and the reflected power for three different operation modes are illustrated representing VSWR protection of 2, 4 and 6.

In an exemplary operation, a VSWR value of 6 is set. Accordingly, the amplifier control 30 controls both digital potentiometers 26, 28 such that the incident power is damped by 4 dB whereas the reflected power is damped by 1 dB resulting in a difference of 3 dB. A difference of 3 dB corresponds to a power ratio of approximately 2. Hence, a power limitation is implemented which is activated when the reflected power is the half of the incident power. It becomes obvious that the output of the power amplifier 10 is limited when the reflected power becomes 50% of the incident power (please refer to graph 6r and 6i representing the reflected power at VSWR 6 and the incident power at VSWR 6).

As already mentioned, this characteristic is established by controlling the digital potentiometers 24, 26 such that they weight the reflected power 3 dB higher than the incident one.

When the reflected power reaches the corresponding threshold value, the sum of the incident power and the reflected power exceed the predetermined power level corresponding to the set VSWR value of 6. Accordingly, the control variable controls the amplifier unit 16 such that its power is limited. Hence, the incident power is lowered and the reflected power is kept constant for VSWR values higher than 6.

The amplifier unit 16 is directly controlled via the feedback line 36 being a galvanic connection such that an analog power limitation is provided.

When the user sets a VSWR value of 4 as protection level, the output of the power amplifier 10 is limited when the reflected power (graph 4r) becomes approximately 36% of the maximum incident power (graph 4i). This characteristic is established by weighting the reflected power approximately 4.4 dB higher than the incident one. When the corresponding power level is reached, the analog power limitation is activated in an analogous manner as described above.

Regarding the VSWR value of 2, the output of the power amplifier 10 is limited when the reflected power (graph 2r) becomes approximately 11% of the maximum incident power (graph 2i). This characteristic is established by weighting the reflected power approximately 9.5 dB higher than the incident one.

In general, the power amplifier 10 is controlled such that the incident power is kept constant at the maximum power corresponding to the set VSWR value. When the weighted actuating variable representing the reflected power increases and the weighted value would exceed the predetermined power level corresponding to the set VSWR value, the analog power limitation of the power amplifier 10 is activated.

Then, a control variable is issued by the power control unit 20 which is fed via the feedback line 36 to the amplifier unit 16 such that the attenuation element in the amplifier unit 16, in particular the power pre-amplifier 38, is activated in order to limit the power of the power amplifier 10 to keep the reflected power constant (please refer to FIG. 3).

Since different VSWR values can be set prior to the operation of the power amplifier 10 and/or during its operation, the weighting of the dedicated signals can be performed in a variable manner. Accordingly, the power amplifier 10 can be used in different operation modes wherein different powers can be output under the different circumstances being related to the different operation modes, for instance safety mode or calibration mode.

Due to the digital adjustment of the potentiometers 26, 28 by the amplifier control 30, the VSWR values can be set during operation of the power amplifier 10.

As explained above, different powers can be issued under different operation modes/different set VSWR values such that the capacities of the power amplifier 10 are utilized. As shown in FIG. 3, the power amplifier can provide about 700 W incident power at a VSWR value of 2, 550 W incident power at a VSWR value of 4 and 400 W incident power at a VSWR value of 6.

Thus, the power amplifier 10 is configured to have different power outputs depending on the operation mode, in particular the VSWR value set. The power control unit 20 ensures that the predetermined power level of the power amplifier 10 is not exceeded during operation wherein the predetermined power level depends on the VSWR value set.

In operation, the power output of the power amplifier 10, in particular the incident power, is controlled by the power control unit 20 such that the predetermined power level is not exceeded.

Moreover, as the power in dependence of the frequencies is relatively stable, the subsequent components, for instance the coupler 18 or combiner, do not have to be oversized as they could be adapted appropriately. Hence, smaller and simpler components can be used which results in a more (cost-) efficient system.

The invention claimed is:

1. A power amplifier with adjustable voltage standing wave ratio comprising:
   an amplifier unit generating an output signal;
   a coupler configured to obtain an incident power of the output signal and a coupled reflected power based on the output signal; and
   a power control unit coupled to the coupler and the amplifier unit wherein the power control unit is configured to control the amplifier unit according to the powers obtained by the coupler, and wherein the power control unit comprises two power detectors configured to provide actuating variables which correspond to the incident power and the reflected power, respectively,
   wherein the power control unit comprises two digital potentiometers which are configured to variably weight the actuating variables, and
   wherein the power control unit is configured to determine a control variable for the amplifier unit based on the actuating variables such that a predetermined power level related to a set value of the voltage standing wave ratio is not exceeded by the incident power and/or the reflected power.

2. The power amplifier according to claim 1, wherein an analog power limitation is provided in order to ensure that the predetermined power level related to the set value of the voltage standing wave ratio is not exceeded.

3. The power amplifier according to claim 1, wherein the power control unit is configured to sum up the actuating variables in order to provide the control variable for the amplifier unit.

4. The power amplifier according to claim 1, wherein the power detectors are configured to convert the incident power and the reflected power into direct voltages, respectively.

5. The power amplifier according to claim 1, wherein an amplifier control is provided which is coupled to the digital potentiometers in order to adjust the weighting of the actuating variables.

6. The power amplifier according to claim 1, wherein the power control unit is connected to the amplifier unit by a feedback line.

7. The power amplifier according to claim 6, wherein the amplifier unit comprises a power pre-amplifier that is driven via the feedback line.

8. The power amplifier according to claim 1, wherein an input interface is provided by which the value of the voltage standing wave ratio is set during operation or prior to operation.

9. The power amplifier according to claim 1, wherein the power amplifier is configured to be operated in at least two different modes having different voltage standing wave ratios.

10. A radio frequency electronic device comprising a power amplifier according to claim 1.

11. A method for operating a power amplifier with adjustable voltage standing wave ratio comprising:
    measuring the incident power of the output signal by a coupler;
    measuring the reflected power of the output signal by the controller;
    providing actuating variables corresponding to the measured powers by a power control unit;
    weighting the actuating variables variably by the power control unit; and
    determining a control variable for the amplifier unit based on the actuating variables by the power control unit such that a predetermined power level related to a set value of the voltage standing wave ratio is not exceeded by the incident power and/or the reflected power.

12. The method according to claim 11, wherein an attenuation element in the power amplifier is activated by the control variable.

13. The method according to claim 11, wherein the actuating variables are summed up in order to determine the control variable for the amplifier unit.

14. The method according to claim 11, wherein the actuating variables are obtained by converting the measured incident power and reflected power into corresponding direct voltages.

15. The method according to claim 11, wherein the value of the voltage standing wave ratio is set during operation or prior to operation.

* * * * *